(12) United States Patent
Ham et al.

(10) Patent No.: US 7,061,101 B2
(45) Date of Patent: Jun. 13, 2006

(54) CARRIER MODULE

(75) Inventors: Chul Ho Ham, Gyeonggi-do (KR);
Byoung Dae Lee, Gyeonggi-do (KR);
Ho Keun Song, Gyeonggi-do (KR);
Young Geun Park, Gyeonggi-do (KR)

(73) Assignee: Mirae Corporation, Chuman Si (KR)

( * ) Notice: Subject to any disclaimer, the term of this patent is extended or adjusted under 35 U.S.C. 154(b) by 0 days.

(21) Appl. No.: 10/797,073

(22) Filed: Mar. 11, 2004

(65) Prior Publication Data
US 2005/0200000 A1    Sep. 15, 2005

(51) Int. Cl.
*H01L 29/74* (2006.01)

(52) U.S. Cl. .................. 257/712; 257/732; 257/48

(58) Field of Classification Search .............. 257/48, 257/678, 718–719, 731; 439/68, 71
See application file for complete search history.

(56) References Cited

U.S. PATENT DOCUMENTS

| | | | | |
|---|---|---|---|---|
| 5,123,850 A | * | 6/1992 | Elder et al. | 439/67 |
| 5,491,419 A | * | 2/1996 | Kerdiya et al. | 324/418 |
| 5,557,212 A | * | 9/1996 | Isaac et al. | 324/755 |
| 5,571,027 A | * | 11/1996 | Roebuck et al. | 439/264 |
| 5,785,799 A | * | 7/1998 | Culnane et al. | 156/379.7 |
| 6,267,603 B1 | * | 7/2001 | Yamamoto et al. | 439/70 |
| 6,425,178 B1 | * | 7/2002 | Lee et al. | 29/759 |
| 6,498,472 B1 | * | 12/2002 | Lee et al. | 324/158.1 |
| 6,873,169 B1 | * | 3/2005 | Ham et al. | 324/755 |
| 2003/0054676 A1 | * | 3/2003 | Sano et al. | 439/73 |
| 2004/0251460 A1 | * | 12/2004 | Lee et al. | 257/48 |

FOREIGN PATENT DOCUMENTS

| | | | |
|---|---|---|---|
| JP | 11-125658 | * | 5/1999 |
| JP | 2000-323249 | * | 11/2000 |
| JP | 2003-86319 | * | 3/2003 |

* cited by examiner

*Primary Examiner*—Nathan J. Flynn
*Assistant Examiner*—Ahmed N. Sefer
(74) *Attorney, Agent, or Firm*—Fleshner & Kim LLP

(57) ABSTRACT

Carrier module including a carrier module body for seating a semiconductor device on an underside thereof, having a pass through hole from an upper part to the underside the semiconductor device is seated thereon, a housing over the carrier module body, a supplementary housing fitted in a lower part of the housing to be movable in up/down directions, for elastic contact with the carrier module body by a first elastic member fitted inside of the housing, a vacuum tube in the supplementary housing so as to be in communication with the pass through hole in the carrier module body, at least one pair of latches in a lower part of the carrier module body to move apart or close in an outer or inner side, for holding or releasing the semiconductor device seated on the carrier module body, a latch button fitted in an upper part of the carrier module body so as to be movable in up/down directions, and coupled to the latch with a connection pin for moving in up/down directions by an external force, to making the latch to move, and a second elastic member for elastic supporting of the latch buttons on the carrier module body, thereby, when the semiconductor device is brought into contact with the test socket, and tested, holding the semiconductor device with a vacuum formed through the pass through hole in the carrier module body and the vacuum tube in a state the latch releases the semiconductor device.

20 Claims, 5 Drawing Sheets

CARRIER MODULE

BACKGROUND OF THE INVENTION

1. Field of the Invention

The present invention relates to carrier modules mounted on a test tray of a handler for testing semiconductor devices, and more particularly, to a carrier module for stable holding, and easy connection to a test socket, of a semiconductor device of a type in which leads, or balls are distributed on entire area or periphery of the semiconductor device, such as an MLF (Micro Lead Frame) or a QFN (Quad Flat No-lead), developed recently.

2. Background of the Related Art

In general, modular ICs, which are circuitry arrangements of memory or non-memory semiconductor devices on a board, are subjected to various tests after production before shipment.

In general, the handler, used for automatic test of semiconductor devices, and modular ICs, progresses the test with a process in which a worker loads a tray having semiconductors to be tested loaded thereon on a loading stacker of a handler, transfers the test trays having the semiconductor devices loaded thereon to a test site, electrically connects lead or ball parts of the semiconductor devices to connectors of the test sockets, carries out required tests, separates the semiconductor devices from the test tray, classifies the semiconductor devices according to a result of the test, and loads on user trays on an unloading stacker.

FIG. 1 illustrates a front view of a test tray having carrier modules mounted thereon schematically, and FIG. 2 illustrates a perspective view of a related art carrier module.

Referring to FIG. 1, the related art test tray 1 is provided with a plurality of carrier modules 2 mounted on a metal frame 11 at regular intervals, for loading the semiconductor devices thereon.

Referring to FIG. 2, the carrier module 2 is provided with a seating part 22 on a hexahedral body 21 for seating the semiconductor device 'D' thereon, and one pair of latches 23 at opposite sides of the seating part 22 for holding/releasing the semiconductor device 'D'.

The latches 23 rotate around hinge shafts (not shown) inside of the body 21 respectively, to open or close the seating part 22, and hold opposite edges having no balls formed thereon of the semiconductor device 'D' seated on the seating part 22.

Referring to FIG. 2, the related art carrier module 2 has the semiconductor device 'D' seated thereon with a ball formed surface thereof faced upward. When the test tray 1 having the semiconductor device 'D' seated thereon thus is transferred to a test site of the handler, the index unit on the test site pushes the carrier module 2 toward the test socket, so that the balls Db of the semiconductor device 'D' are brought into contact with terminal pins (not shown) of the socket, to enable the test.

However, though the related art carrier module 2 can hold the semiconductor device 'D' adequately with the latches 23 when the semiconductor device 'D' has many parts no balls Db or leads (not shown) are formed therein, the related art carrier module 2 can not hold the semiconductor device 'D' securely in a case the balls or the leads are distributed over an entire area of the semiconductor device 'D', such as current MLF or QFN, or the semiconductor device 'D' is very small, when parts for holding the semiconductor device with the latches 23 can not be secured, adequately.

SUMMARY OF THE INVENTION

Accordingly, the present invention is directed to a carrier module that substantially obviates one or more of the problems due to limitations and disadvantages of the related art.

An object of the present invention is to provide a carrier module for semiconductor device test handler for stable holding of a semiconductor device of which size is very small, or has leads positioned in an entire area or entire periphery thereof, or balls positioned on an entire area thereof, such as MCF, or QFN, and bringing the leads or balls of the semiconductor device into positive contact with a test socket at a test site, securely.

Additional features and advantages of the invention will be set forth in the description which follows, and in part will be apparent to those having ordinary skill in the art upon examination of the following or may be learned from practice of the invention. The objectives and other advantages of the invention will be realized and attained by the structure particularly pointed out in the written description and claims hereof as well as the appended drawings.

To achieve these objects and other advantages and in accordance with the purpose of the present invention, as embodied and broadly described herein, the carrier module includes a carrier module body for seating a semiconductor device on an underside thereof, having a pass through hole from an upper part to the underside the semiconductor device is seated thereon, a housing over the carrier module body, a supplementary housing fitted in a lower part of the housing to be movable in up/down directions, for elastic contact with the carrier module body by a first elastic member fitted inside of the housing, a vacuum tube in the supplementary housing so as to be in communication with the pass through hole in the carrier module body, at least one pair of latches in a lower part of the carrier module body to move apart or close in an outer or inner side, for holding or releasing the semiconductor device seated on the carrier module body, a latch button fitted in an upper part of the carrier module body so as to be movable in up/down directions, and coupled to the latch with a connection pin for moving in up/down directions by an external force, to making the latch to move, and a second elastic member for elastic supporting of the latch buttons on the carrier module body, thereby, when the semiconductor device is brought into contact with the test socket, and tested, holding the semiconductor device with a vacuum formed through the pass through hole in the carrier module body and the vacuum tube in a state the latch releases the semiconductor device.

The carrier module further includes a heat sink in a central part of the carrier module body, for bringing into contact with a surface of the semiconductor device, and transferring heat.

The carrier module further includes an O-ring fitted at a connection part of the supplementary housing and the carrier module body.

The latch has a slanted slot of a long hole form for inserting a guide pin therein, wherein the latch is opened or closed, as the slanted slot slides along the guide pin.

The carrier module further includes a latch pusher projected upward from one side part of the test socket to be brought into contact with the semiconductor device, and a projection projected outwardly from an outer part of the latch, for being brought into contact with the latch pusher.

It is to be understood that both the foregoing description and the following detailed description of the present invention are exemplary and explanatory and are intended to provide further explanation of the invention claimed.

BRIEF DESCRITPION OF THE DRAWINGS

The accompanying drawings, which are included to provide a further understanding of the invention and are incorporated in and constitute a part of this application, illustrate embodiment(s) of the invention and together with the description serve to explain the principle of the invention.

DETAILED DESCRIPTION OF THE PREFERRED EMBODIMENT

Reference will now be made in detail to the preferred embodiments of the present invention, examples of which are illustrated in the accompanying drawings.

Figure 1:
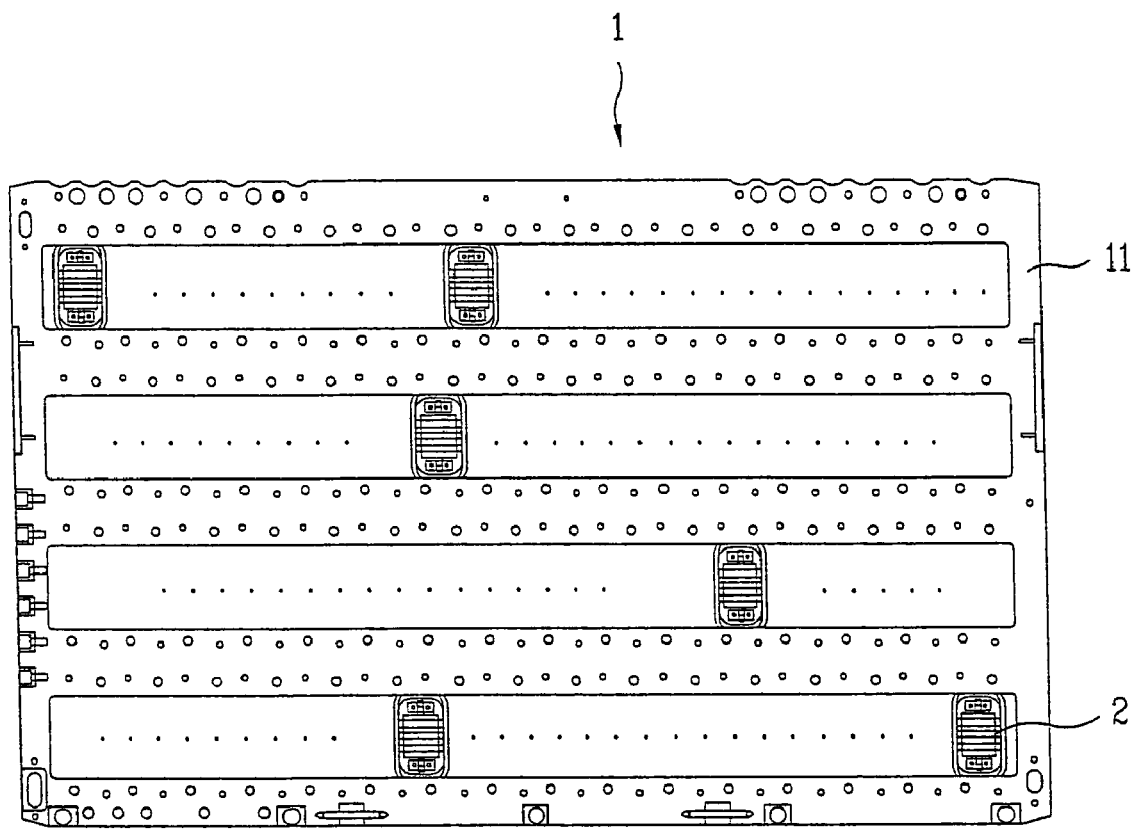
FIG. 1 illustrates a front view of a test tray having related art carrier modules mounted thereon.
Figure 2:
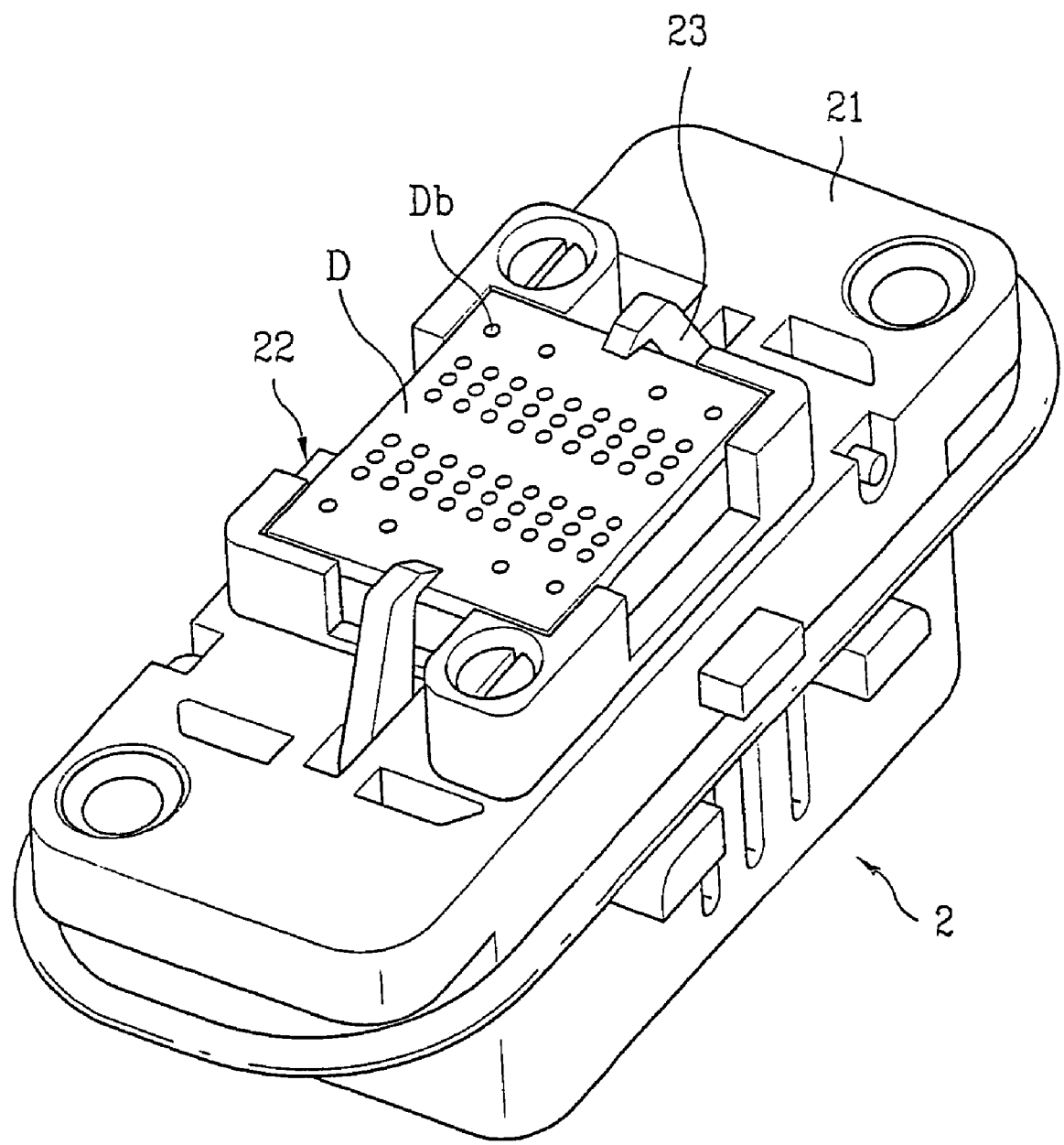
FIG. 2 illustrates a perspective view of a related art carrier module.
Figure 3:
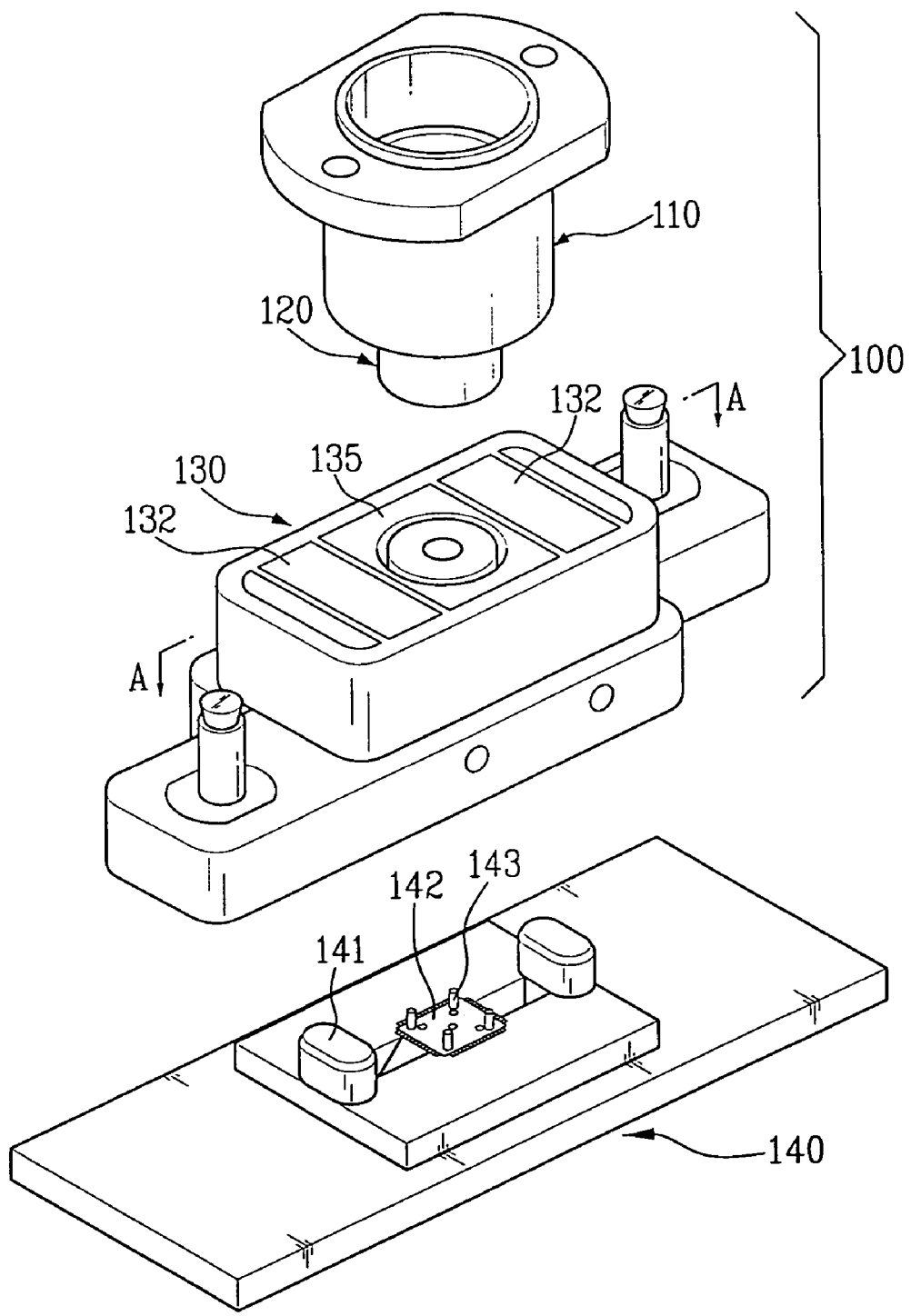
FIG. 3 illustrates a perspective view showing a housing, a carrier module, and a test socket.
Figure 4A:
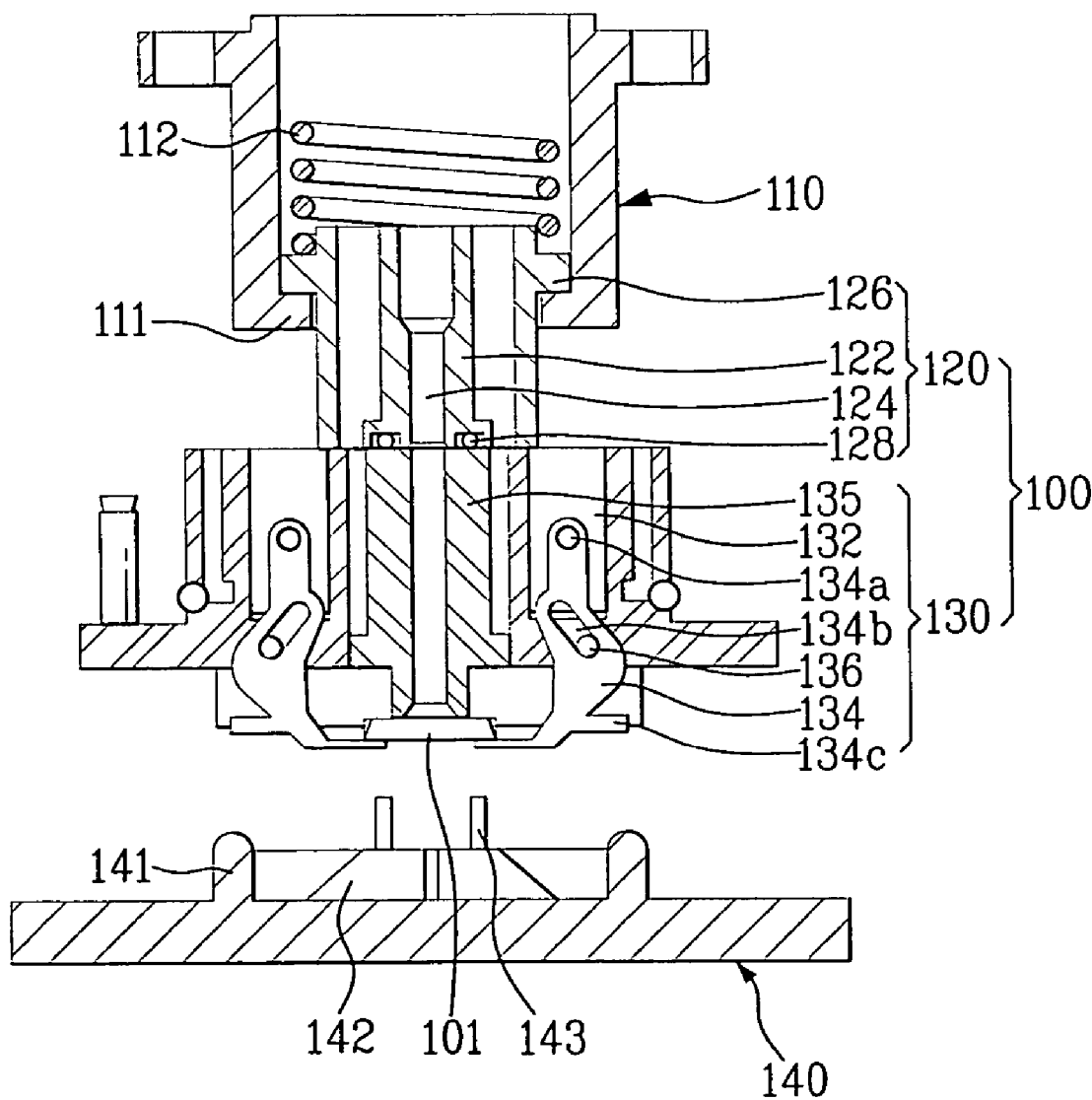
FIG. 4A illustrates a section across a line A—A of a carrier module having a semiconductor device held with latches.
Figure 4B:
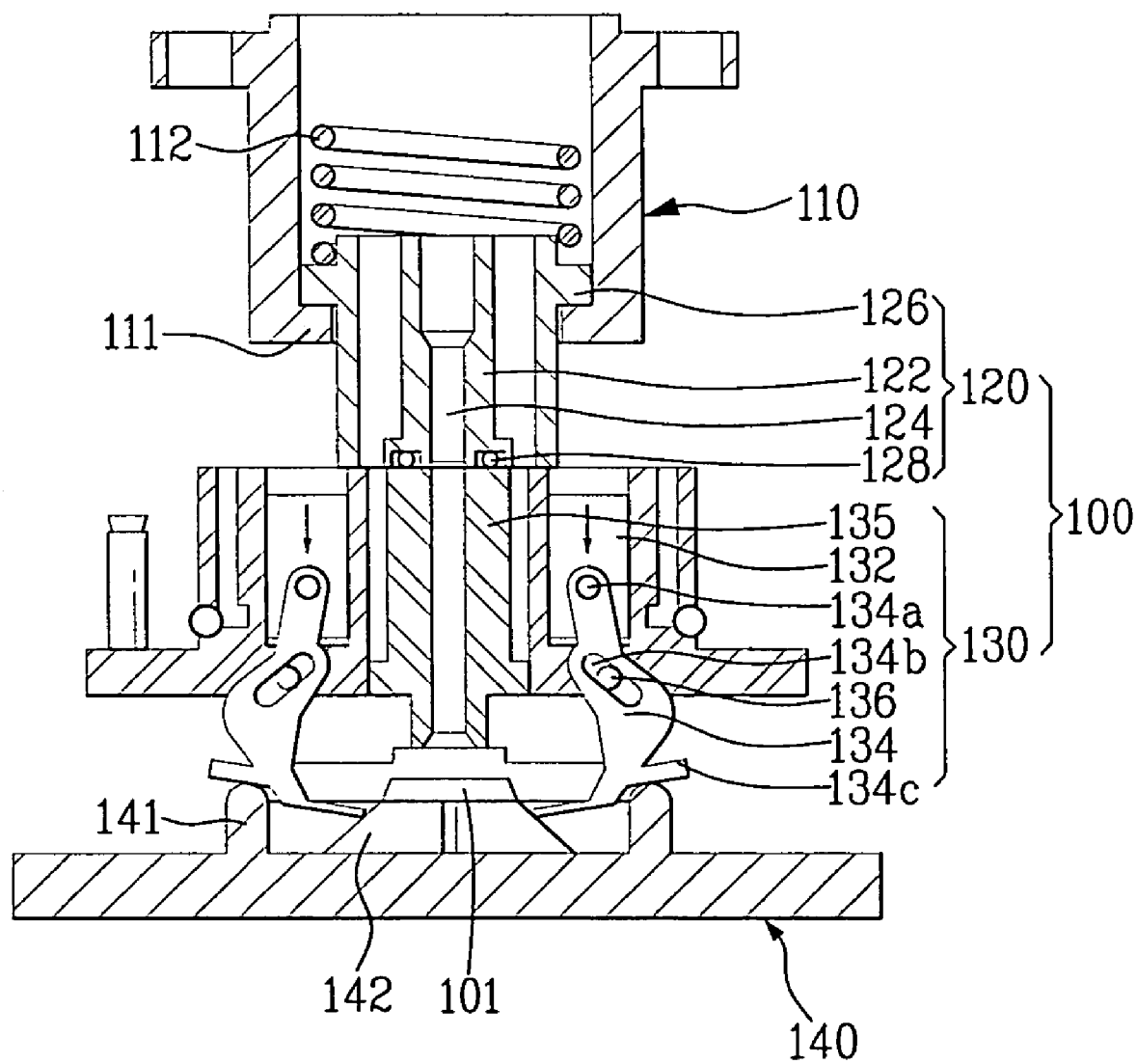
FIG. 4B illustrates a section across a line A—A of a carrier module in a state when latches are released, and a semiconductor device held with a vacuum tube is under testing.

FIG. 3 illustrates a perspective view showing a housing, a carrier module, and a test socket, FIG. 4A illustrates a section across a line A—A of a carrier module having a semiconductor device held with latches, and FIG. 4B illustrates a section across a line A—A of a carrier module in a state when latches are released, and a semiconductor device held with a vacuum tube is under testing.

Referring to FIG. 3, the carrier module of the present invention includes a housing 110, a supplementary housing 120 joined to the housing 110, and a carrier module body 130 joined to an underside of the supplementary housing 120. There is a test socket 140 under the carrier module body 130 for testing the semiconductor device 101.

There are a plurality of latch buttons 132 at opposite sides of the carrier module body 130 spaced a distance from each other, and a heat sink 135 between the latch buttons 132 for transfer of heat from the semiconductor device.

The carrier module body 130 is in contact with an upper part of the underlying test socket 140, and the semiconductor device 101 can be tested with the test socket 140.

The test socket 140 includes a plurality of latch pushers 141 at opposite sides, a seating part 142 between the latch pushers 141 for seating and testing the semiconductor device 101, and supporting posts 143 on the seating part 142 for guiding the semiconductor device 101.

Referring to FIGS. 4A, and 4B, the housing 110 includes an annular projection 111 in a lower part for holding the supplemental housing 120, and an elastic member 112 inside thereof for elastic supporting of the supplementary housing (telescoping housing) 120.

The supplementary housing 120 includes a pusher 126 in an upper part seated on, and held by the annular projection 111 formed inside of the housing 120, and a vacuum tube (a first internal vacuum conduit) 122 inside of the pusher 126.

The vacuum tube 122 has a vacuum hole 124 for inlet/outlet of a vacuum source, with one end fitted with an O-ring 128 for preventing drop of the vacuum due to leakage of the vacuum source.

The vacuum tube 122 can be brought into contact with, or move away from, the heat sink 135 containing a second internal vacuum conduit in a central part of the carrier module body 130, and leakage of the vacuum source from a part the vacuum tube 122 in contact with the heat sink 135 and a first end of the second internal vacuum conduit can be prevented by the O-ring 128 at one end of the vacuum tube 122 so that a vacuum is kept.

The heat sink 135 and the second internal vacuum conduit has one end (a second end) in contact with the semiconductor device 101, for receiving temperature variation of the semiconductor device 101. The heat sink 135 can carry out any functions of heat dissipating, or heating.

The carrier module body 130 includes a plurality of latch buttons 132 at opposite sides movable in up/down directions, latches 134 under the latch buttons 132 rotatably connected to connection pins 134a respectively, and elastic members each (not shown) on an underside of the latch button 132.

The latch 134 has a slanted long hole 134b in a central part, having a guide pin 136 inserted therein. The latch 134 is arranged to slide along the guide pin 136 in the long hole 134b.

The latch 134 has a projection 134c at an outer side for being pressed by a latch pusher 141.

Since the latches 134 are arranged opposite to each other, the latches 134 can hold a bottom of the semiconductor device securely, while the latches 134 are opened or closed as the latch buttons 132 connected to the latches 134 from above move up/down.

The latch button 132 can move up by an elastic force of an elastic member (not shown) under the latch button 132, and the latch button 132 can move down by the pusher member (not shown).

The move up/down of the latch button 132 opens or closes the latch 134, which separates or holds the semiconductor device 101.

The system and operation of the carrier module of the present invention will be described in more detail.

Referring to FIGS. 4A and 4B, the carrier module 100 of the present invention tests the semiconductor device 101 in a state the semiconductor device 101 is released from the latches 134 in a lower part of the carrier module body 130, and held by vacuum at one end of the heat sink 135.

When the pusher members (not shown) push the plurality of latch buttons at opposite sides of the carrier module body 130, the latch buttons 132 move down, and according to this, the latches 134 under, and connected to the latch button 132 with the connection pins 134a move down.

As the guide pins 136 slide in the slanted long holes 134b inside of the latches 134, the latches 134 rotate around the connection pins 134a and opened from each other.

After opening the latches 134, if the pusher members (not shown) pushing down the latch buttons 132 are released, the elastic restoring forces of the elastic members (not shown) under the latch buttons 132 make a reverse action of the opening action of the latches 134, to close the latches 134, to hold a bottom surface of the semiconductor device 101, securely.

The secure holding of the semiconductor device 101 with the latches 134 enables to prevent the semiconductor device from falling off the latches 134.

In the meantime, the heat sink 135 in the carrier module body 130 can heat an object or dissipate heat from the object to an outside of the object. A temperature test of the semiconductor device 101 held by the latches 134 may be carried out by using heat from the heat sink 135.

When the latch pushers 141 push the projections 134c at one side of the latches 134, the semiconductor device 101 held by the latches 134 can be separated.

Then, the semiconductor device 101 is held at one end of the heat sink 135 by vacuum transmitted to the vacuum hole 124, and the semiconductor device 101 held by the vacuum is seated on the seating part 142 of the test socket 140, and tested.

Moreover, a state of holding of the semiconductor device 101, i.e., holding, or the presence of the semiconductor device 101 or not, can be known from the vacuum at the vacuum hole 124.

As has been described, since the latches are operated in holding the semiconductor device, and the semiconductor device held by vacuum at the same time with opening the latches can be tested in the semiconductor device test, the semiconductor device can be tested while the semiconductor device is securely held even in a case a size of the semiconductor is very small, or balls or leads on an underside of the semiconductor device are distributed on entire edges of an underside surface of the semiconductor device.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A carrier module, comprising:
    a carrier module body for seating a semiconductor device on an underside thereof, having a pass through hole from an upper part to the underside where the semiconductor device is seated thereon;
    a housing over the carrier module body;
    a supplementary housing fitted in a lower part of the housing to be movable in up/down directions, for elastic contact with the carrier module body by a first elastic member fitted inside of the housing;
    a vacuum tube in the supplementary housing so as to be in communication with the pass through hole in the carrier module body;
    at least one pair of latches in a lower part of the carrier module body to move apart or close in an outer or inner side, for holding or releasing the semiconductor device seated on the carrier module body;
    at least one latch button fitted in an upper part of the carrier module body so as to be movable in up/down directions, and coupled to the at least one pair of latches with a connection pin for moving in up/down directions by an external force, to move the at least one pair of latches; and
    a second elastic member for elastic supporting the at least one latch button on the carrier module body,
    thereby, when the semiconductor device is brought into contact with a test socket, and tested, the semiconductor device is held with a vacuum formed through the pass through hole in the carrier module body and the vacuum tube while the at least one pair of latches releases the semiconductor device, and wherein the housing and the supplemental housing are not constituent parts of the carrier module body.

2. The carrier module as claimed in claim 1, further comprising a heat sink in a central part of the carrier module body, for being brought into contact with a surface of the semiconductor device, and for transferring heat.

3. The carrier module as claimed in claim 1, further comprising an O-ring fitted at a connection part of the supplementary housing and the carrier module body.

4. The carrier module as claimed in claim 1, wherein the at least one pair of latches has a slanted slot of a long hole form for inserting a guide pin therein, wherein the at least one pair of latches is opened or closed, as the slanted slot slides along the guide pin.

5. The carrier module as claimed in claim 1, wherein the at least one pair of latches further comprise:
    a projection projected outwardly from an outer part of each latch, wherein the projection is configured to be brought into contact with a latch pusher on the test socket to thereby open each latch.

6. A carrier module, comprising:
    a housing having an internal accommodating space;
    a supplemental housing that is partially accommodated in the internal accommodating space of the housing and having a vacuum tube; and
    a carrier module body having a latch and a through hole, wherein one end of the through hole seats a semiconductor device and is configured to hold the semiconductor device with a vacuum, and the other end of the through hole is aligned and communicates with the vacuum tube, wherein the housing and the supplemental housing are not constituent parts of the carrier module body.

7. The carrier module of claim 6, wherein a first elastic member is further accommodated in the internal accommodating space of the housing and elastically supports the supplemental housing.

8. The carrier module of claim 7, wherein the supplementary housing includes an annular pusher formed around the supplementary housing for receiving support from the first elastic member.

9. The carrier module of claim 8, wherein the housing includes an annular projection for seating the annular pusher of the supplemental housing.

10. The carrier module of claim 6, wherein the vacuum tube and the through hole are configured to keep a vacuum when mated.

11. The carrier module of claim 10, wherein an O-ring is fitted to one of an end of the vacuum tube and an end of the through hole, to thereby keep the vacuum.

12. The carrier module of claim 11, wherein the O-ring is fitted to an end of the vacuum tube.

13. The carrier module of claim 6, wherein the carrier module body further includes a heat sink for at least one of heating, and dissipating heat from, a semiconductor device seated on the carrier module.

14. The carrier module of claim 13, wherein the through hole is formed through the heat sink.

15. A carrier module, comprising:
    a telescoping housing having a first internal vacuum conduit; and
    a carrier module having a latch and a second internal vacuum conduit having a first and a second end, wherein the first internal vacuum conduit is in vacuum communication with the first end of the second internal conduit, and wherein both the latch and the second end of the second internal conduit are configured to hold a semiconductor device, wherein the telescoping housing is not a constituent part of the carrier module.

16. The carrier module of claim 15, wherein the first internal vacuum conduit of the telescoping housing and the second internal vacuum conduit of the carrier module are fitted to form a continuous vacuum conduit.

17. The carrier module of claim 15, wherein the second vacuum conduit is formed by a heat sink formed through the carrier module, and a first end of the heat sink contacts the first vacuum conduit and a second end of the heat sink is configured to contact a semiconductor device.

18. The carrier module of claim 15, further comprising a latch button which is slidingly fitted to the carrier module; and a guide pin fLxed to the carrier module, wherein the latch further comprises an elongated slanted hole that accommodates the guide pin and pivots about a connection pin attached to the latch button, so that when the latch button is moved, the latch pivots about the connection pin while the guide pin guides the movement of the slanted hole to open the latch.

19. The carrier module of claim 18, wherein the latch further comprises a projection for contact with a latch pusher of a test socket.

20. The carrier module of claim 15, wherein the presence of the semiconductor device on the second end of the second internal conduit is determined by the presence of a vacuum formed in the first and second internal conduits.

* * * * *